Aug. 3, 1965 M. M. A. A. G. VERSTRAELEN 3,199,052

CRYSTAL OSCILLATOR

Filed Sept. 11, 1961

INVENTOR
MARIE M.A.A.G. VERSTRAELEN.
BY
AGENT

United States Patent Office 3,199,052

Patented Aug. 3, 1965

3,199,052

CRYSTAL OSCILLATOR

Marie Marcel Antoine Arnold Ghislain Verstraelen, Hilversum, Netherlands, assignor to North American Philips Company, Inc., New York, N.Y., a corporation of Delaware Filed Sept. 11, 1961, Ser. No. 137,326
Claims priority, application Netherlands, Sept. 9, 1960, 255,784
5 Claims. (Cl. 331—116)

The invention relates to a crystal oscillator employing two transistors. In a known oscillator of this type, the transistors are connected in alternating current cascade and are each provided with a natural resistance of the emitter to stabilise the operating point. The crystal ungrounded and is connected in a positive feedback circuit between the emitters of the two transistors. The disadvantage of such a circuit is that the phase of the positive feedback circuit is influenced by the wiring capacitance of the crystal which, in particular when the crystal is connected in a thermostat, may be substantial.

The object of the invention is to provide an oscillator which has excellent stability and reliability. The oscillator employs a stabilised cascade circuit of two transsistors, in which the collector of the first transistor is connected, for direct current, to the base of the second transistor and the emitter of the second transistor is connected, for direct current, to the base of the first transistor. The cascade circuit may be caused to oscillate by feedback coupling of the collector of the second transistor to the base of the first transistor. According to the invention, the crystal is connected in a circuit parallel to a resistor through which the emitter-direct current of the second transistor flows.

As a result of the measures according to the invention, an oscillator is obtained with few circuit elements and which is substantially insensitive to temperature variations and supply voltage variations. This is the result of the co-operation of a number of favourable factors, namely:

(*a*) Small distortion owing to the negative feedback across both stages;

(*b*) A stabilised transistor adjustment point as a result of the large amplification of the two transistors in the direct current negative feedback path;

(*c*) Adaptation to the very low series resonance impedance of the crystal, so that the crystal may oscillate at or in the proximity of its series resonance frequency;

(*d*) The crystal may be grounded at one end; and (*e*) The operating point adjustment of the two transistors is independent of the proportioning of the alternating current feedback circuit.

Figure 1:
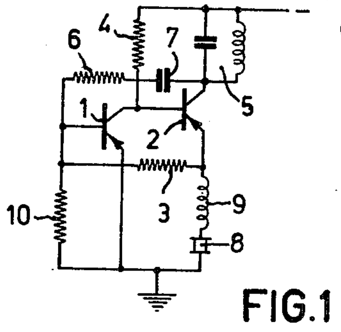
Figure 3:
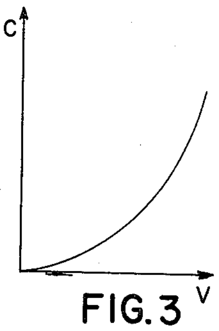
Figure 2:
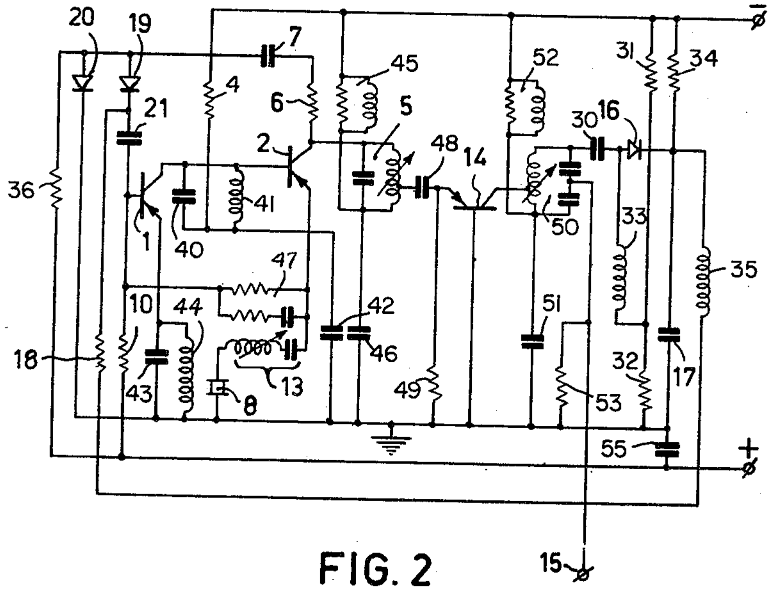

In order that the invention may be readily carried into effect, it will now be described, by way of example, with reference to the accompanying drawing, in which FIGURE 1 is a circuit diagram of an oscillator according to the invention, FIGURE 2 is a more detailed circuit diagram of the oscillator of the invention, and FIGURE 3 is a characteristic curve of the diodes employed in the circuit of FIGURE 2.

The oscillator shown in FIGURE 1 comprises a first transistor 2, the collector of which is connected for direct current to a base of a second transistor 2. The emitter of the transistor 2 is connected for direct current to the base of transistor 1 through a resistor 3. As is known, an amplifier having a stabilized operating point is obtained in this manner. The operating current for the collector of the transistor 1 and the base of the transistor 2 respectively is supplied through a resistor 4 connected to these electrodes.

The collector circuit of transistor 2 comprises a circuit 5 tuned to the oscillator frequency and having a low selectivity. The voltage across this circuit is fed back to the base of the transistor 1 through the positive feedback resistor 6, if desired in series with a blocking capacitor 7, so that the circuit arrangement may start oscillating. The base of transistor 1 is connected to ground by way of resistor 10. In order to obtain a particularly stable oscillator frequency, a crystal 8, if desired, in series with a reactance 9, is connected parallel with the series connected resistors 3 and 10 in which the emitter direct current of the transistor 2 flows. As a result of this circuit arrangement, at the series resonance frequency of the crystal 8, or that of the circuit 8–9 respectively, the negative feedback coupling due to resistor 3 is reduced to such an extent that the loop amplification becomes larger than unity and an oscillation is produced. The frequency of the oscillation is exactly equal to this series resonance frequency. The reactance 9 or, if desired, a series resonance circuit serves for the accurate control of the frequency produced.

The oscillator is extremely stable, not only because of the use of a crystal but also because a negative feedback coupling is operative through the resistor 3 across both stages 1 and 2, and this resistor also stabilises the operating point of the transistor. Since this negative feedback coupling moreover insures that the impedance of the circuit arrangement, measured at the emitter of the transistor 2, is very small with respect to the crystal impedance, the frequency will not be substantially influenced by spreading in the transistor properties and of the further circuit components used respectively. Therefore the oscillator frequency is determined substantially only by the crystal.

In FIGURE 2 the collector of transistor 1 is connected to the base of transistor 2. A tuned circuit comprising a capacitor 40 connected in parallel with an inductor 41 is connected from the collector of transistor 1 to ground through a by-pass capacitor 42. The circuit is tuned to the oscillator frequency to thus provide maximum transfer of the oscillation frequency. The emitter of transistor 1 is connected to ground through a parallel circuit comprising a capacitor 43 which places the emitter at A.C. ground and an inductor 44 which places it at D.C. ground. The collector and base of transistors 1 and 2, respectively, are connected to the negative terminal of the power supply, not illustrated, by a resistor 4.

The collector of transistor 2 is connected to the negative supply terminal through an adjustable tuned circuit 5 and an RF choke 45 which prevents passage of the RF frequencies, and a by-pass capacitor 46 establishes a signal path between the tuned circuit 5 and ground. The emitter of transistor 2 is connected to ground through a series connected inductor and capacitor 13 in series with crystal 8. Here as opposed to the connection shown in FIGURE 1 a series resonant circuit including an adjustable inductor connected in series with a capacitor is used to provide for adjustment of the oscillation frequency.

Negative feedback is provided between the emitter of transistor 2 and the base of transistor 1 via a parallel circuit 47, which provides frequency selective negative feedback for selectively adjusting the gain of the circuit, and a resistor 10 connected between ground and the base of transistor 1.

The positive feedback loop includes in addition to resistor 6 and capacitor 7 a diode 19 and a blocking capacitor 21 connected in series between the collector of transistor 2 and the base of transistor 1. Diode 19 and blocking capacitor 21 provide a switching function in an automatic volume control loop which will be described in greater detail later.

A tap on tuned circuit 5 is connected by a coupling capacitor 48 to the emitter of a grounded base connected transistor amplifier 14 and the emitter is connected to ground by a load resistor 49. The collector of transistor 14 is connected to an adjustable tuned circuit 50 which is connected to ground by a by-pass capacitor 51 and to the negative terminal of the supply voltage source by an RF choke 52 which is identical to choke 45 in both structure and function.

A first tap on tuned circuit 50 is connected to ground through a load resistor 53 and to an output terminal 15 at which output terminal the oscillation frequency is available. A second tap on the tuned circuit 50 is connected by a coupling capacitor 30 to the anode of a diode 16.

A pair of resistors 31 and 32 are serially connected between the negative supply terminal and ground and the common junction is connected by an A.C. isolating inductor 33 to the anode of diode 16 to provide a D.C. bias voltage. The cathode of diode 16 is connected to the negative supply terminal via a resistor 34 to complete the biasing of diode 16. A capacitor 17 is connected between the cathode of diode 16 and ground and is charged by the positive signal pulses which are added to the bias voltage at the cathode. The common junction of capacitor 17 and resistor 34 is connected to the cathode of diode 19 by an isolation inductor 35 in series with a resistor 18 and the voltage to which capacitor 17 charges as a result of the positive peaks of the signal is used to control the current through diode 19, the voltage-current characteristic of which are plotted in FIGURE 3.

A diode 20, similar to diode 19 has its anode connected to the common junction of diode 19 and capacitor 7 in the feedback loop and its cathode connected to ground. The anode of diode 20 is connected by a resistor 36 to the positive supply terminal and a filter capacitor 55 is connected between the positive supply terminal and ground.

Resistors 6 and 18 have a large value with respect to the differential resistors of the diodes 19 and 20, while the impedance of the blocking capacitor 21 in series with the base input resistance of the transistor 1 (which is decreased considerably by the negative feedback coupling across circuit 47) is small with respect to these differential resistors. It may be proven that the feedback current flowing through the resistor 6 is distributed substantially distortion-free, between the two diodes 19 and 20 in a ratio which depends upon the direct current adjustment of these diodes. Therefore, if the oscillator amplitude should tend to increase by any cause, for example owing to a variation of temperature or supply voltage respectively, the rectifier 16 produces a corresponding voltage across the condenser 17 which changes the bias current of the rectifier 19 so that the substantially distortion-free current fed back to the base of the transistor 1 is decreased. In this manner, the stability of the oscillator is further improved, while the freedom from distortion is insured.

What is claimed is:

1. A transistor crystal oscillator comprising first and second transistors, each having at least an emitter, a collector and a base electrode, a direct current connection between the collector of said first transistor and the base of said second transistor, positive feedback circuit means connected between the collector of said second transistor and the base of said first transistor, an emitter direct current path for said second transistor, said direct current path comprising negative feedback resistance means, means connecting said negative feedback resistance means between the emitter of said second transistor and the base of said first transistor, a source of operating current, means connecting said source between the emitters and collectors of said transistors, crystal means, and means connecting said crystal means in parallel with at least a portion of said direct current path.

2. The oscillator of claim 1 comprising means connected to said oscillator for providing a direct current proportional to the amplitude of oscillations of said oscillator, and said positive feedback circuit means comprising first and second non-linear impedance means having substantailly exponential current-voltage characteristics, means interconnecting said impedance means so that feedback current is distributed between said impedance means in a ratio dependent upon their respective resistances, means applying the feedback current from only one of said impedance means to the base of said first transistor, and means for applying said direct current proportional to the amplitude of oscillations to said one impedance means.

3. The oscillator of claim 1 comprising means connected to said oscillator for providing a direct current proportional to the amplitude of oscillations of said oscillator, and said positive feedback circuit means comprising first and second diode means having substantially exponential current-voltage characteristics, means connecting said first diode means serially between said collector of said second transistor and said base of said first transistor, a source of potential, resistor means, means serially connecting said second diode means and resistor means to said source of potential, means connecting an electrode of said first diode means to the junction of said resistor means and second diode means, and means applying said direct current to the other electrode of said first diode means.

4. A transistor crystal oscillator comprising first and second transistors, a first direct current connection between the collector of said first transistor and the base of said second transistor, a second direct current connection between the emitter of said second transistor and the base of said first transistor, positive feedback circuit means connected between the collector of said second transistor and the base of said first transistor, a source of operating current having first and second terminals, means connecting said first terminal to the collector of said first transistor, means connecting said first terminal to the collector of said second transistor, means connecting said second terminal to the emitter of said first transistor, resistance means connecting said second terminal to said second direct current connection, crystal means, and means connecting said crystal means in parallel with said resistance means.

5. A transistor crystal oscillator comprising first and second transistors each having at least an emitter, a collector and a base electrode, a direct current connection between the collector of said first transistor and the base of said second transistor, positive feedback circuit means connected between the collector of said second transistor and the base of said first transistor, a source of operating current, impedance means connecting said direct current connection to said source, parallel resonant circuit means connecting the collector of said second transistor to said source, means connecting the emitter of said first transistor to a point of constant potential, first resistance means, means connecting said first resistance means between the emitter of said second transistor and the base of said first transistor, second resistance means, means connecting said second resistance means between an end of said first resistance means and a point of constant potential whereby said first and second resistance means provide a direct current path for the emitter current of said second transistor, crystal means, and means connecting said crystal means in parallel with at least a portion of said direct current path.

References Cited by the Examiner

UNITED STATES PATENTS

| | | | |
|---|---|---|---|
| 2,070,647 | 2/57 | Braaten | 331—159 |
| 2,912,654 | 11/59 | Hansen | 331—117 |

OTHER REFERENCES

Electronic Engineering, August 1959, page 468.

ROY LAKE, *Primary Examiner.*

JOHN KOMINSKI, *Examiner.*